United States Patent [19]

Krehbiel

[11] Patent Number: 5,026,297
[45] Date of Patent: Jun. 25, 1991

[54] ELECTRICAL SOCKET ASSEMBLY FOR SINGLE IN-LINE CIRCUIT PACKAGE

[75] Inventor: Fred L. Krehbiel, Lake Forest, Ill.
[73] Assignee: Molex Incorporated, Lisle, Ill.
[21] Appl. No.: 545,215
[22] Filed: Jun. 28, 1990
[51] Int. Cl.⁵ .............................................. H01R 13/00
[52] U.S. Cl. .................................................... 439/326
[58] Field of Search ............... 439/296, 325, 326, 327, 439/328

[56] References Cited

U.S. PATENT DOCUMENTS 4,128,289 12/1978 Occhipinti ........................... 439/326

*Primary Examiner*—Joseph H. McGlynn
*Attorney, Agent, or Firm*—Louis A. Hecht; Stephen Z. Weiss; A. A. Tirva

[57] ABSTRACT

A socket assembly is provided for receiving a memory module or single in-line package (SIP). The socket assembly includes a cover for protectively receiving the SIP. The cover includes an opened bottom from which the mating edge of the SIP extends. The socket assembly further includes a housing having a slot for receiving the mating edge of the SIP. A plurality of terminals are mounted in the housing in proximity to the slot for engaging conductive regions along the mating edge of the SIP. The housing includes locking latches for engaging the cover upon rotation of the cover into an alignment corresponding to full mating of the SIP.

18 Claims, 4 Drawing Sheets

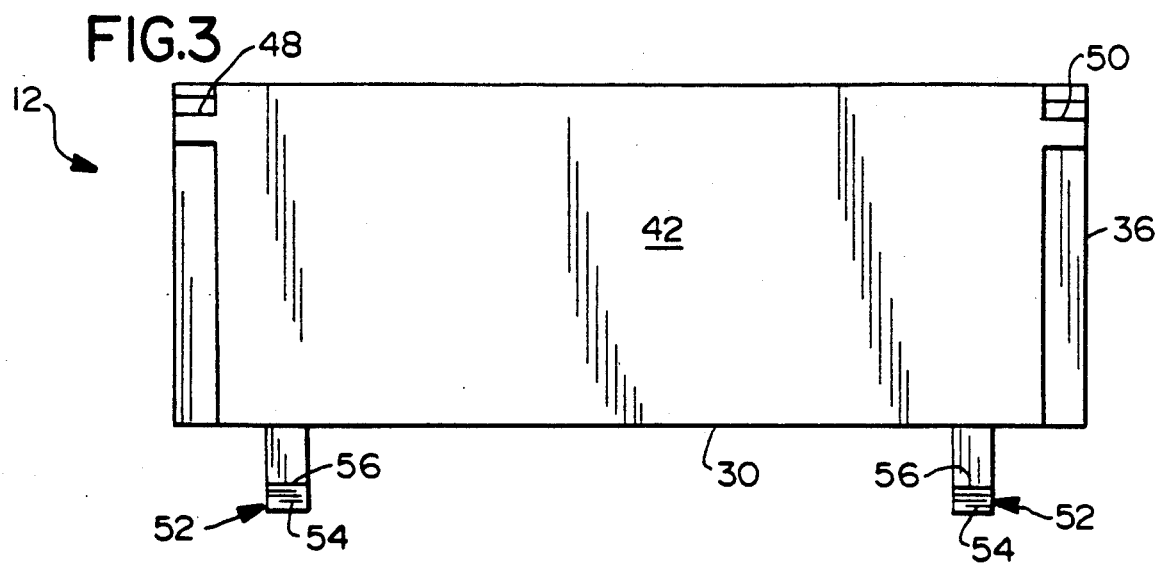
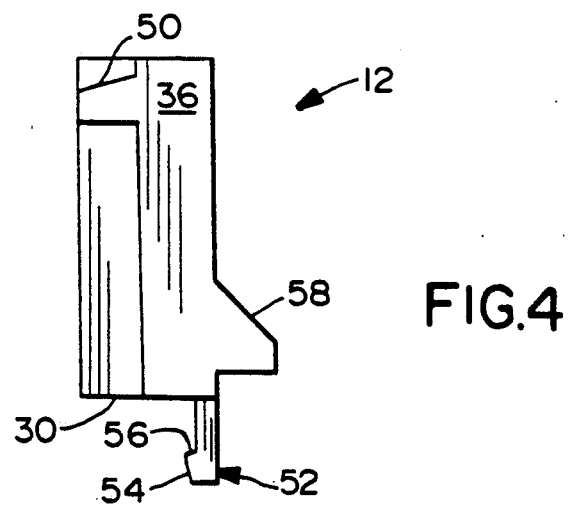
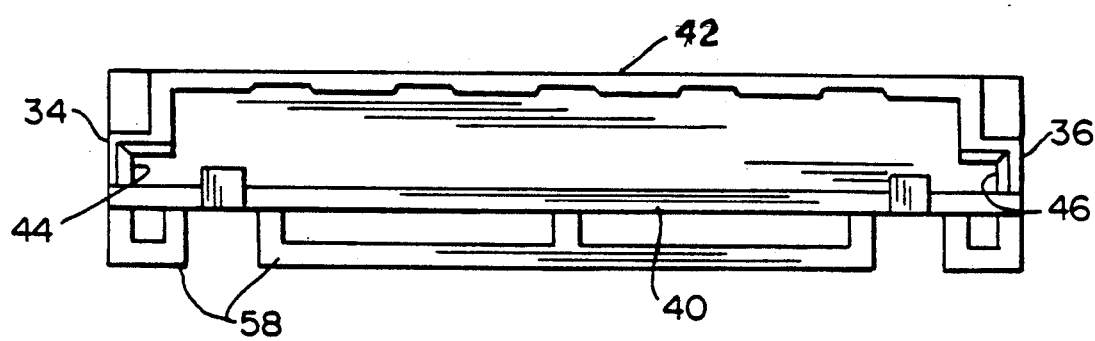

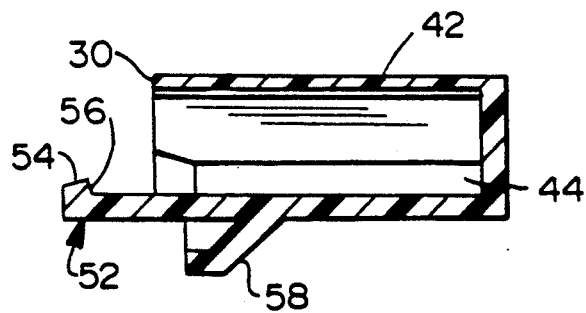
FIG.6
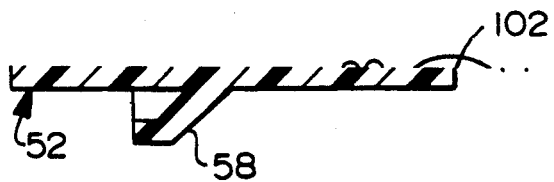
FIG.6
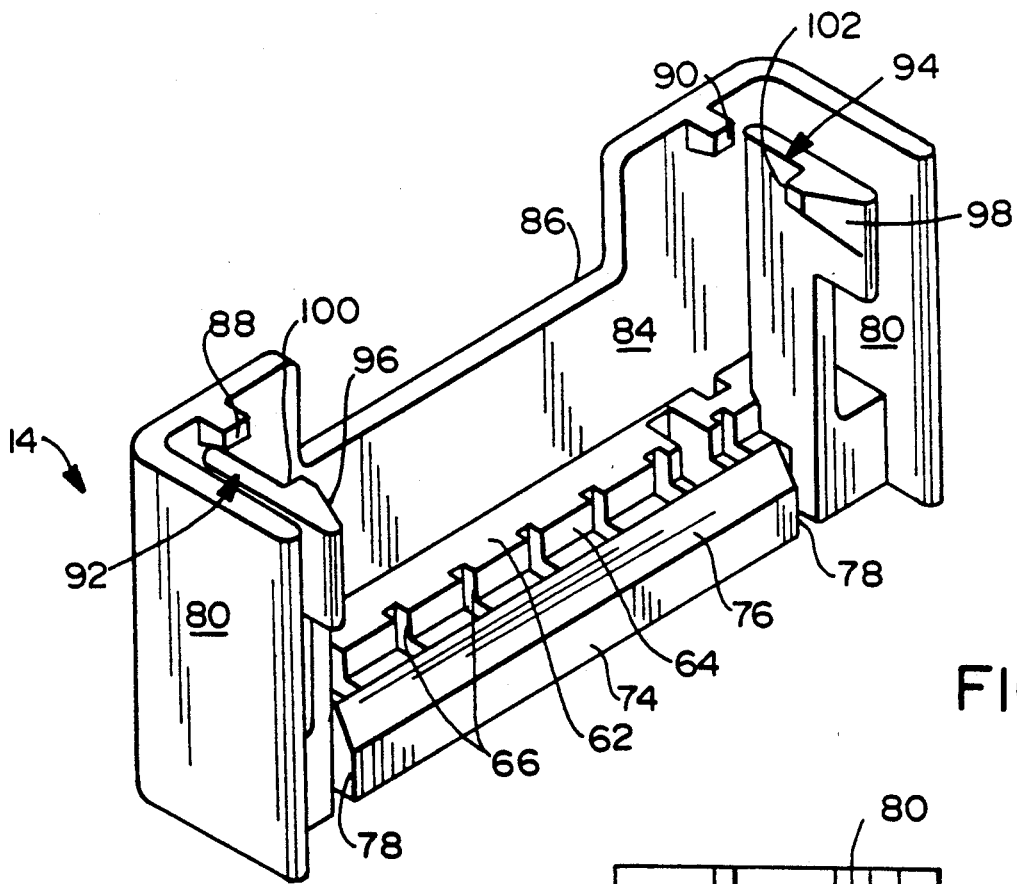
FIG.7
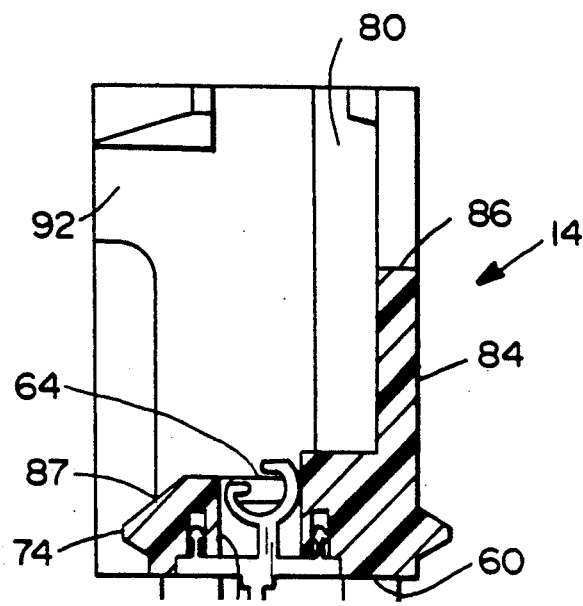

ELECTRICAL SOCKET ASSEMBLY FOR SINGLE IN-LINE CIRCUIT PACKAGE

BACKGROUND OF THE INVENTION

A single in-line memory module (SIMM) or a single in-line package (SIP) comprises a generally planar substrate having an array of electrical components disposed thereon. The components on the substrate may comprise "intelligent" electrical components, such as integrated circuit chips. These components are appropriately connected to one another by circuitry disposed on the substrate. The circuitry extends to discrete conductive regions that are equally spaced along one edge of the planar substrate.

A memory module or single in-line package is removably engageable with a socket that typically is mounted to a circuit board, panel or the like. More particularly, the prior art socket comprises a slot dimensioned to engage the edge of the substrate having the discrete conductive regions. The socket further includes a plurality of terminals extending at least partly into the slot to contact the discrete conductive edge regions of the memory module or single in-line circuit package.

Many prior art sockets for memory modules or single in-line packages are designed for the simple pushing or pulling of the module or package into or out of the slot generally along the plane of the substrate. The movement of the single in-line package into the slot causes the terminals of the prior art socket to deflect, and the resiliency of the deflected terminals causes contact forces to be exerted against the conductive regions on the edge of the single in-line package. These contact forces are intended to insure consistent high quality electrical connection to the conductive regions on the edge of the single in-line package. Although prior art sockets of this type may perform well in many environments, it is difficult to design such a push-pull socket that will achieve a low insertion force for the single in-line package, and that also will achieve high normal contact forces between the terminals of the socket and the conductive regions on the edge of the package. Insertion or withdrawal forces that are too high can damage either the package or the terminals of the socket to which the circuit package is mateable. Conversely, a socket designed to facilitate the pushing of the circuit package into the socket or the pulling of the circuit package out of the socket generally will achieve lower normal contact forces between the terminals of the socket and the conductive regions on the edge of the circuit package. These lower contact forces make it difficult to assure that the socket will perform well during all ranges of vibration, shock or temperature to which the socket may be presented. In this regard, it should be noted that extreme ranges of vibration, shock and temperature often are encountered in automotive vehicles and aircraft and in some office machines or computers.

To overcome the inherent problems with push-pull sockets for single in-line packages or memory modules, sockets have recently been developed which enable low insertion and withdrawal forces and that achieve a high quality electrical connection. More particularly, the fairly recent prior art includes sockets that enable a single in-line package to be inserted into the slot of the socket at a first angle with negligible insertion force and that then enable the package to be rotated into a second angular alignment at which a high contact force is achieved. These prior art sockets include means for releasably locking the single in-line package or memory module in an angular alignment corresponding to optimum contact forces. Additionally, these prior art sockets may include means for preventing the single in-line package or memory module from being vibrated or pulled out of the completely inserted position in the socket. Examples of very desirable prior art sockets of this type are shown in U.S. Pat. No. 4,575,172 which issued Walse, et al. on Mar. 11, 1986 and U.S. Pat. No. 4,713,013 which issued to Regnier, et al. on Dec. 15, 1987. These two prior art patents are assigned to the assignee of the subject invention, and the disclosures are incorporated herein by reference.

Recent generations of single in-line packages include substrates formed from ceramic materials. Many of the substrates are somewhat fragile and can be damaged if subjected to direct force or extreme vibration. The forces that are likely to damage such a ceramic substrate could be those encountered during insertion of the single in-line package into a socket, removal of the single in-line package from a socket or a direct inadvertent contact with a fully seated package. In particular, some small single in-line packages having fragile substrates may be subject to damage in response to forces generated against the ramped surfaces of the latches on some prior art sockets. The memory module or single in-line packages usually are safely removed from the prior art socket by merely rotating the latches away from one another such that the biasing forces of the terminals in the socket will cause the memory module or package to effectively pop out of its fully seated alignment into an alignment where it is free of the latches. Unfortunately, however, many technicians will not follow this preferred removal feature. Thus, a technician may manually exert rotational forces on the memory module or single in-line package against the locking forces of the latches. Additionally, technicians often will attempt to merely pull the memory module or package out of the socket in a direction aligned with the plane of the substrate. These improper withdrawal forces can easily damage the fragile substrate employed on many currently manufactured single in-line packages.

Even if a memory module is properly inserted and withdrawn from its socket there are many environments where damage can be caused by inadvertent contact. For example, sophisticated electronic circuitry is now commonplace in most automotive vehicles. Many portions of this circuitry, such as an engine management system, require single in-line memory modules or single in-line packages to control or coordinate operations. These modules and packages often are disposed at locations where they may inadvertently be contacted by a technician performing work on a nearby part of the vehicle. Additionally, the memory modules and single in-line packages employed in the automotive environment are subjected almost continuously to extreme conditions of vibration, shock and temperature change. These environmental conditions and the likelihood of direct contact create the potential for damage to the fragile substrate incorporated into many such memory modules and single in-line packages.

In view of the above, it is an object of the subject invention to provide a socket assembly for single in-line packages of electronic circuitry.

It is another object of the subject invention to provide a socket assembly for avoiding damage to a single in-line package mated therewith.

It is an additional object of the subject invention to provide a single in-line package socket assembly that prevents direct force on the substrate of the package during mating and unmating.

Still a further object of the subject invention is to provide a socket assembly for a single in-line package that enables the package to be substantially completely enveloped and protected in its mated condition.

SUMMARY OF THE INVENTION

The subject invention is directed to a socket assembly for a single in-line memory module or a single in-line package, both of which will be referred to generally herein as a SIP. The SIP comprises a generally planar substrate which may be formed from a ceramic material and which has electrical components mounted to at least one side thereof. The components on the substrate of the SIP may comprise integrated circuit chips and other components which are electrically connected to discrete conductive regions along one edge of the SIP. More particularly, the substrate of the SIP may be substantially rectangular with a mating edge along which the discrete conductive regions are disposed. The SIP may further comprise a pair of parallel side edges extending orthogonally from the mating edge and a top edge extending parallel to the mating edge. In this context, the term top is not intended to imply a required gravitational orientation. In most embodiments, as explained herein, the components and circuitry of the SIP are disposed on one side thereof and are spaced inwardly from the respective edges.

The socket assembly of the subject invention comprises a cover for engaging and protecting the SIP. The cover may be unitarily molded from a non-conductive material and may define an opened-bottom box-like enclosure. More particularly, the cover preferably comprises opposed substantially parallel front and rear walls, opposed substantially parallel first and second side walls extending between and connecting the front and rear walls and a top wall connected to and extending between the front, rear and side walls of the cover. The bottom of the cover is in generally opposed relationship to the top wall and is opened to permit insertion of the SIP into the cover as explained herein. The distance between the top wall of the cover and the opened bottom may be such that the mating edge of the SIP extends beyond the opened bottom of the cover when remaining portions of the SIP are disposed in the cover.

The opposed side walls of the cover may define means for slidably engaging a SIP inserted therein. In this regard, the side walls of the cover may define parallel channels dimensioned to receive the side edges of the SIP. Exterior regions on the cover adjacent the side walls may define at least one locking surface for engagement with latches on the socket assembly as explained further below. Exterior regions on the side walls may further define surfaces for engaging protrusions on the socket assembly to prevent a non-rotational pull-out of the cover and the SIP from the socket assembly. The walls of the cover may further comprise support means for guiding the SIP into an initial angular alignment and for permitting efficient accurate repeatable rotation of the SIP into a second angular alignment corresponding to full insertion and optimum mating.

The cover may further comprise means for securely retaining the SIP therein. In this regard, the cover may comprise resilient latch means for lockingly engaging an edge region of the SIP to prevent unintended removal. In a preferred embodiment, as explained further herein, latches of the cover are disposed and dimensioned to engage the mating edge of the SIP.

The SIP socket assembly of the subject invention further comprises a housing that may be unitarily molded from a non-conductive material. The housing includes an elongated slot therein for receiving the mating edge of the SIP. A plurality of electrically conductive terminals may be lockingly engaged in the housing in proximity to the slot. The terminals may be identical or similar to those disclosed in the above referenced U.S. Pat. No. 4,575,172 or U.S. Pat. No. 4,713,013. As explained in those prior patents, the terminals permit the mating edge of the SIP to be inserted at a first angle with negligible or low insertion force, and then permit the SIP to be rotated into a second angular alignment where high normal contact forces are achieved between the terminals of the socket and the conductive regions on the mating edge of the SIP. The housing of the socket assembly comprises means for lockingly engaging the SIP and/or the cover in an alignment corresponding to complete insertion. The housing may further include at least one wall for protecting the SIP and preventing direct contact therewith. The latches and the wall may be constructed to cooperate with the cover for ensuring adequate protection to the SIP. In this regard, the latches may be disposed and configured to deflect upon engagement with the cover and to subsequently lockingly engage portions of the cover. The housing may further include protrusions formed thereon for lockingly engaging portions of the SIP or portions of the SIP cover for preventing the SIP from being pulled out of the socket or from vibrating free of the socket.

In certain alternate embodiments, the housing may comprise compliant support beams for supporting the SIP in relationship to rigid protective walls of the housing and the cover. In these embodiments, the cover may perform a different role and may be engaged with the housing and not directly with the SIP. More particularly, in these later embodiments, the SIP may be mounted to the housing prior to engagement with the cover. The compliant support beams will protect the SIP from shock or vibration. Further protection of the SIP may be provided by the cover which may be telescoped over the fully mated SIP and housing.

BRIEF DESCRIPTION OF THE DRAWINGS

FIG. 3 is a rear elevational view of the cover.

FIG. 4 is an end elevational view of the cover.

FIG. 5 is a bottom plan view of the cover.

FIG. 6 is a cross-sectional view taken along line 6—6 in FIG. 5.

FIG. 7 is a perspective view of the housing of the subject SIP socket assembly.

FIG. 10 is a cross-sectional view taken along line 10—10 in FIG. 8.

DETAILED DESCRIPTION OF THE PREFERRED EMBODIMENTS

Figure 1:
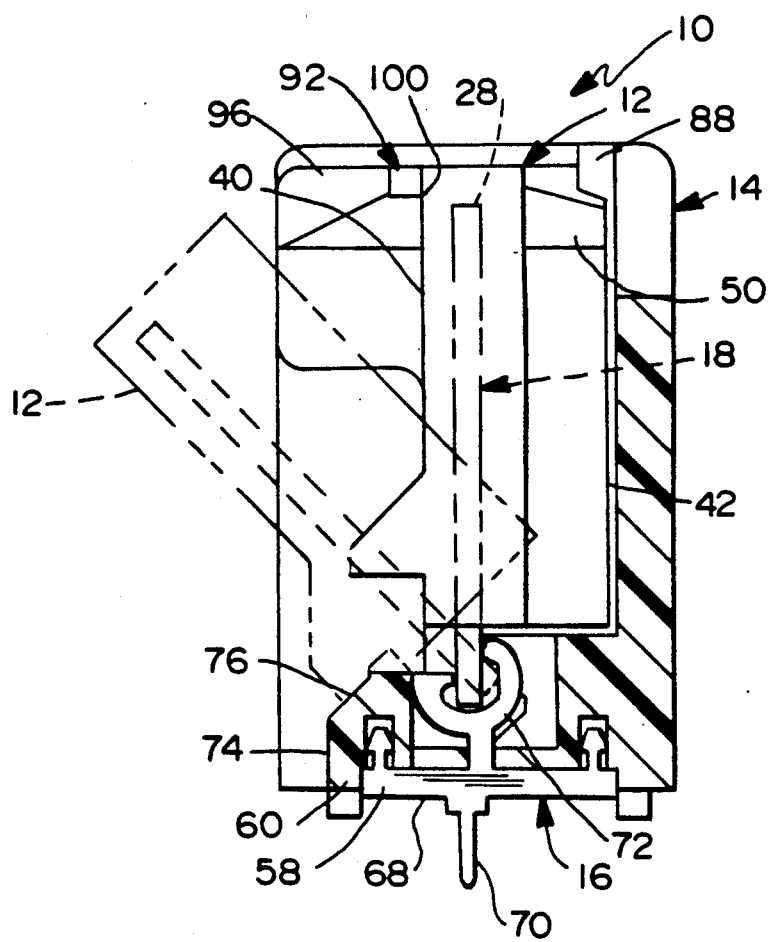
FIG. 1 is an end elevational view, partly in section, of the SIP socket assembly of the subject invention.

The SIP socket assembly of the subject invention is identified generally by the numeral 10 in FIG. 1. The SIP socket assembly 10 comprises a cover 12 which is selectively lockingly engageable with a housing 14. The housing 14 includes a plurality of terminals 16 disposed to electrically engage a SIP 18 as explained herein.

Figure 2:
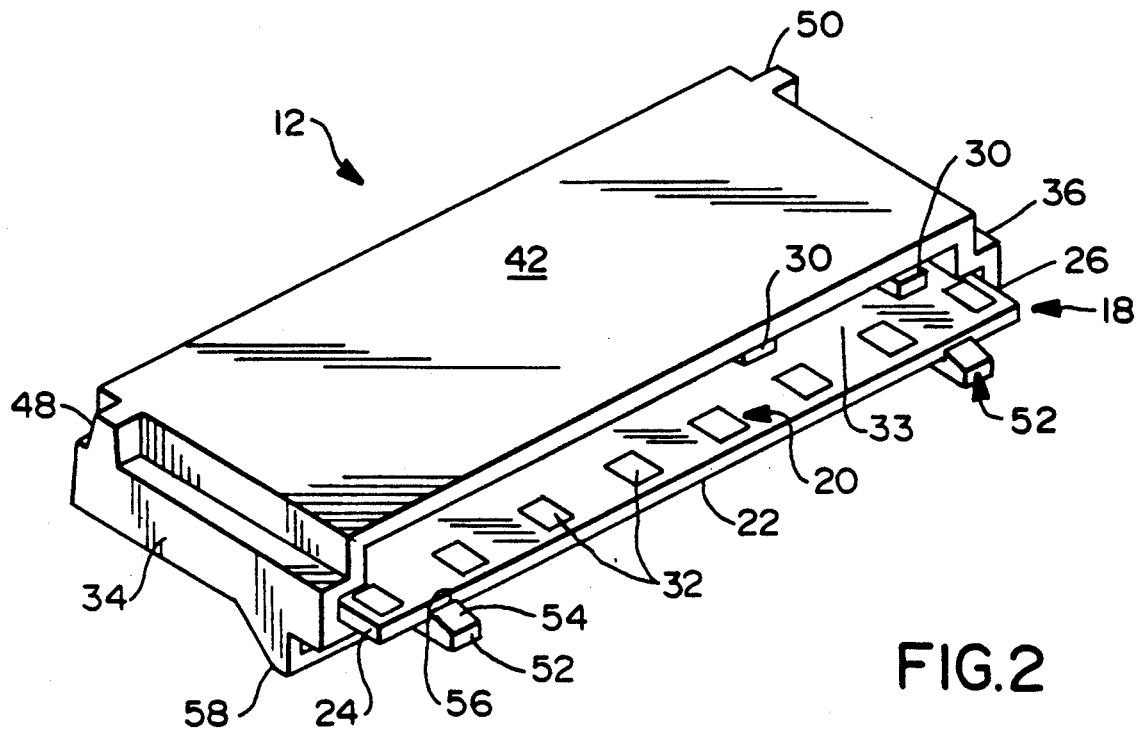
FIG. 2 is a perspective view of a SIP engaged in the cover of the subject SIP socket assembly.
Figure 8:
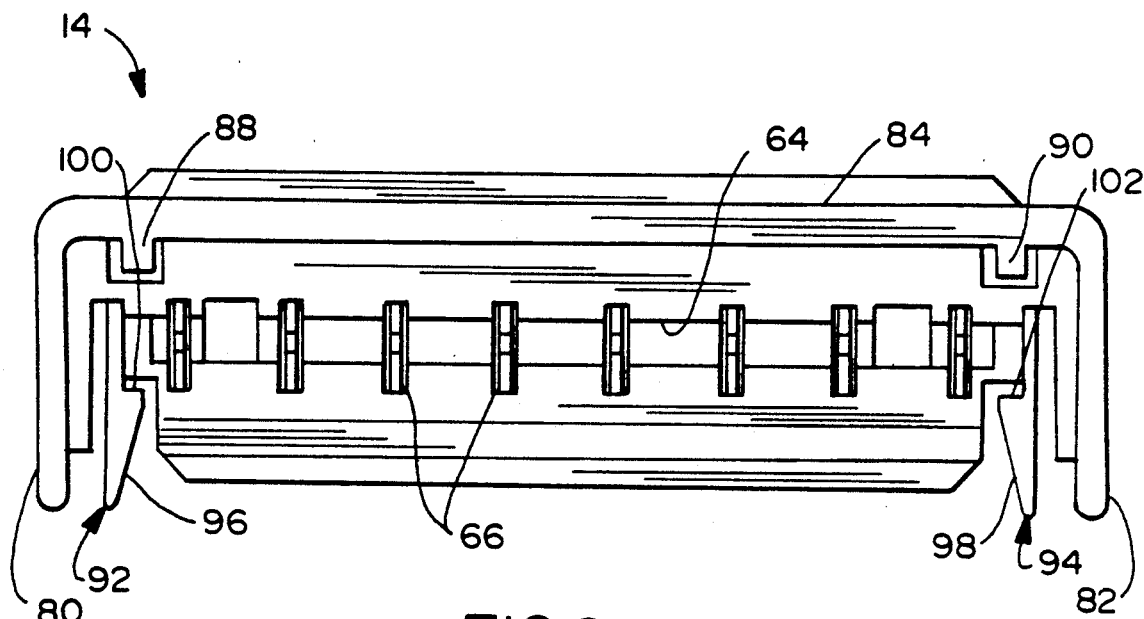
FIG. 8 is a top plane view of the housing with terminals mounted therein.
Figure 9:
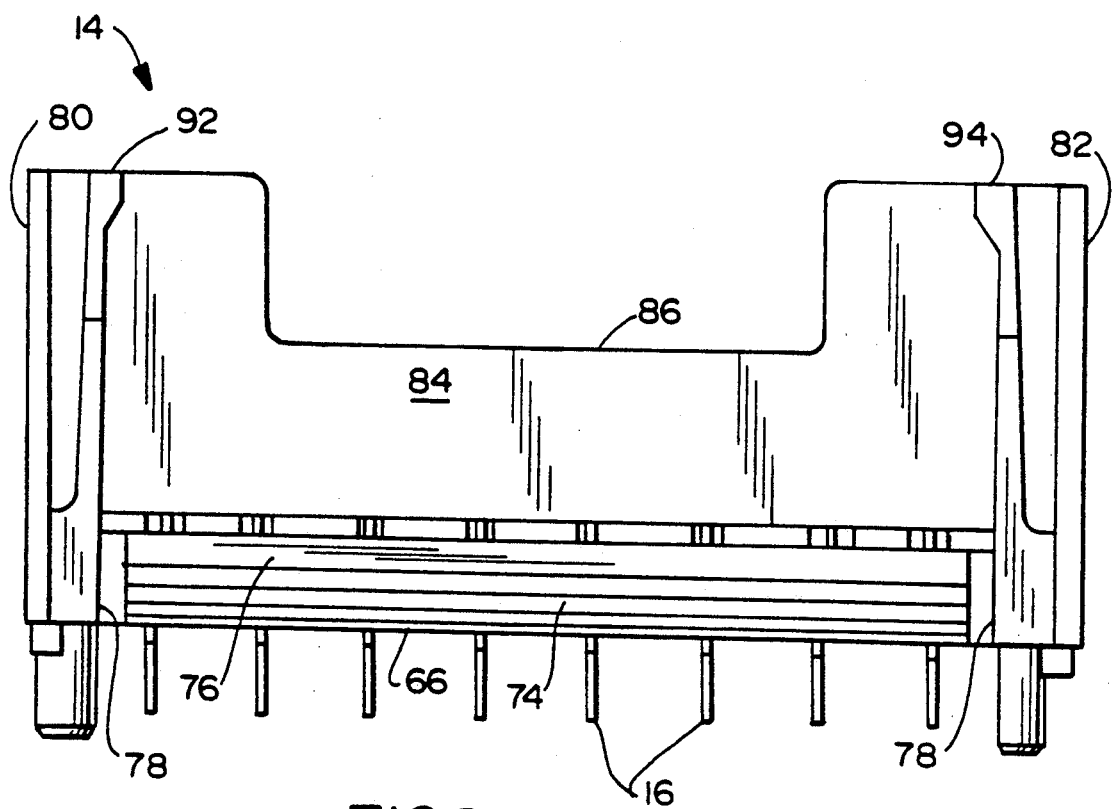
FIG. 9 is a front elevational view of the housing and terminals depicted in FIG. 8.

The cover 12 and SIP 18 are depicted more clearly in FIG. 2. More particularly, the SIP 18 comprises a planar substrate 20 of generally rectangular configuration. The substrate 20 typically will be substantially inflexible and may be formed from a ceramic material. The substrate 20 includes a mating edge 22, first and second substantially parallel side edges 24 and 26 extending orthogonally from the mating edge 22 and a top edge 28 which is shown in FIG. 1 and extends parallel to the mating edge 22 between the first and second side edges 24 and 26. The substrate 20 of the SIP 18 is provided with a plurality of electrical components 30 disposed on one surface thereof. The components 30 are electrically connected to discrete conductive regions 32 spaced along the mating edge 22 of the substrate 20. The SIP 18 may be an integral portion of the engine management system for an automotive vehicle or part of the intelligent electrical circuitry of some other apparatus.

The SIP 18 is slidably and lockably disposed within the cover 12. More particularly, the cover 12 is unitarily molded from a non-conductive material and defines a generally rectangular box-like enclosure having an open bottom 33. The cover 12 further is characterized by opposed first and second side walls 34 and 36, a top wall 38 and front and rear walls 40 and 42 respectively. As illustrated most clearly in FIG. 5, the first and second end walls 34 and 36 are formed to define first and second interiorly disposed guide channels 44 and 46 respectively. The first and second guide channels 44 and 46 are spaced from one another and are dimensioned for receiving the respective first and second edges 24 and 26 of the SIP 18. The guide channels 44 and 46 are adjacent the front wall 40 to provide space between the substrate 20 and the rear wall 42 for the components 30. Exterior portions of the first and second side walls 34 and 36 are formed to define locking shoulders 48 and 50 respectively which function to prevent a pull-out of the cover 12 and/or the SIP 18 from the housing 14 as explained further below. The locking shoulders 48 and 50 are tapered to enable secure locking engagement as the cover 12 is rotated into the housing 14.

The cover 12 is further characterized by deflectable locking latches 52 which extend from the wall 40. The locking latches 52 each include a ramped rearwardly facing lower face 54 and a locking edge 56 which faces the top wall 38 of the cover 12. The length of each latch 52 is selected to enable the SIP 18 to be lockingly engaged within the cover 12. More particularly, the latches 52 will be deflected away from the rear wall 42 upon engagement by the top edge 28 of the SIP 18. The latches 52 will remain deflected while the first and second side edges 24 and 26 of the SIP are being slidably advanced into the first and second channels 44 and 46 in the side walls 34 and 36 of the cover 12. Upon sufficient insertion of the SIP 18 into the opened bottom 32 of the cover 12, the mating edge 22 of the SIP 18 will clear the locking edges 56 of the latches 52. The latches 52 will then resiliently return toward an undeflected condition such that the locking edges 56 thereof engage the lower mating edge 22 of the SIP 18. As a result, the SIP 18 will be securely engaged within the cover 12 between the locking edges 56 of the latches 52 and the top wall 38 of the cover 12 to prevent movement of the SIP toward or away from the top wall 38. Simultaneously, the engagement of the first and second side edges 24 and 26 of the SIP 18 in the first and second channels 44 and 46 will prevent movement of the SIP 18 between the side walls 34 and 36, and will further prevent movement of the SIP 18 between the front and rear walls 40 and 42. Thus, the SIP 18 is positively retained within the cover 18 and the substrate 20 and components 30 will not be damaged by contact with the cover 12. Furthermore, the rigid cover 12 will prevent inadvertent direct contact with the SIP 18 by an automotive technician working near the SIP socket assembly 10 of the subject invention.

The cover 12 further includes a positioning wall 58 extending from the front wall 40 thereof. The positioning wall 58 will engage a portion of the housing 14 during initial insertion of the SIP 18 into the housing 14. This aspect of the subject SIP socket will be described further below.

The housing 14 of the subject SIP socket assembly 10 is illustrated most clearly in FIGS. 7-10. The housing 14 is unitarily molded from a non-conductive material and includes an elongated lower face 60 for mounting to a circuit board, panel or the like. An opposed upper face 62 is characterized by an elongated slot 64 dimensioned for receiving the mating edge 22 of the above described SIP 18. A plurality of terminal receiving cavities 66 extend through the housing 14 from the lower face 60 thereof to the slot 64 in the upper face 62. The terminal receiving cavities 66 are constructed to receive the terminals 16 as shown in FIG. 1 above. More particularly, with reference to FIG. i, each terminal 16 includes a mounting portion 68 for looking engagement with a portion of the housing 14 defining the terminal receiving cavities 66. A solder tail 70 or other such circuit engaging means extends from the mounting portion 68 for electrical connection to circuitry printed or otherwise disposed on a circuit board or the like. A generally C-shaped SIP mating portion 72 extends upwardly from the mounting portion 68 with the respective arms of the C-shaped mating portion 72 being disposed to extend into the slot 64 of the housing 14. The C-shaped mating portion 72 is operative to engage a corresponding conductive region 32 along the mating edge 22 of the SIP 18. Terminals suitable for use in the subject SIP socket assembly are shown and described in greater detail in the above referenced related applications and patents, such as U.S. Pat. No. 4,575,172 and U.S. Pat. No. 4,713,013, the disclosures of which have been incorporated herein by reference.

The housing 14 is further characterized by a front face 74 extending substantially orthogonally from the bottom face 60 and an alignment face 76 extending angularly between the front face 74 and the upper face 62. The alignment face 76 defines a surface of the housing 14 for engaging the positioning wall 58 of the cover 12 during initial insertion of the SIP 18 into the socket assembly 12. The front face 74 and the alignment face 76 are further characterized by notches 78 which are disposed and dimensioned to engage the respective latches 52 of the cover 12 as explained further below.

The housing 14 is further characterized by first and second end walls 80 and 82 and a rear wall 84 extending continuously and unitarily therebetween. The rear wall 84 is characterized by a centrally disposed access opening 86 to enable convenient access to the cover 12 for urging the cover 12 into an angular alignment corresponding to an unmated condition of the SIP 18 as explained herein. The rear wall 84 of the base 14 is further characterized by tapered projections 88 and 90 for engaging the respective tapered locking shoulders 48 and 50 on the cover 12 to prevent the linear pulling of the cover 12 out of the housing 14 as part of an improper attempt to unmate the SIP 18. The tapered configurations are complementary to enable secure face-to-face engagement as the cover 12 is rotated toward the rear wall 84 of the housing 14.

The housing 14 further includes first and second deflectable locking latches 92 and 94 which are disposed symmetrically inwardly from the respective first and second end walls 80 and 82. The latches 92 and 94 include ramped leading faces 96 and 100 respectively and locking faces 98 and 102 respectively. The ramped leading faces 96 and 98 will enable the latches 92 and 94 to deflect away from one another in response to forces generated by the cover 12 as the cover 12 is rotated into an angular alignment corresponding to complete mating, as explained further herein. The locking faces 100 and 102 are disposed to engage the rear face 42 of the cover 12 upon rotation of the cover 12 into a position corresponding to full mating of the SIP 18. It will be noted that the first and second end walls 80 and 82 perform a dual function of protecting the cover 12 and the SIP 18 mounted therein and providing overstress protection for the latches 92 and 94.

In use, the SIP 18 is slid into the opened bottom 32 of the cover 12 by aligning the first and second side edges 24 and 26 of the SIP 18 with the first and second channels 44 and 46 in the cover 12. Upon sufficient slidable insertion of the SIP 18 into the cover 12, the looking latches 52 of the cover 12 will engage the mating edge 22 of the SIP 18. Movement of the SIP 18 relative to the cover is prevented along all axes by the engagement of the latches 52 and by the engagement of the channels 44 and 46 with the SIP 18.

The assembled SIP 18 and cover 12 may then be mounted to the housing 14 such that the conductive regions 32 along the mating edge 22 of the SIP 18 will engage the respective terminals 16. More particularly, the cover 12 is urged into the housing such that the rear face 42 of the cover 12 is in opposed facing relationship to the rear wall 84 of the housing 14. Longitudinal positioning of the cover 12 to the housing 14 is achieved in part by the advancement of the latches 52 of the cover 12 into the notches 78 of the housing 14. A proper initial angular alignment and linear positioning of the cover 12 is achieved by the engagement of the positioning wall 58 of the cover 12 with the alignment face 76 of the housing 14. This initial engagement will prevent an over-insertion of the cover 12 and SIP 18 at this first angular alignment that could conceivably damage the fragile terminals 16 in the housing 14. The cover 12 is then rotated toward the rear face 84 of the housing 14. As this rotation proceeds, the engagement of the cover 12 with the ramped leading faces 96 and 98 of the latches 92 and 94 will deflect the latches 92 and 94 away from one another. However, upon sufficient rotation of the cover 12, as shown in FIG. I, the front face 40 of the cover 12 will clear the locking faces 100 and 102 of the latches 92 and 94. At this point during the rotation, the latches 92 and 94 will resiliently return toward an undeflected condition in which the locking faces 100 and 102 of the latches 92 and 94 will securely engage portions of the front face 40 in proximity to the respective first and second side walls 34 and 36. It should also be noted that in this alignment, the locking shoulders 48 and 50 of the housing 12 will rotate under the protrusions 88 and 90 of the housing 14. This face-to-face engagement of the locking shoulders 48 and 50 with the protrusions 88 and 90 will prevent an improper upward movement of the cover 12 that may be attempted to improperly remove the SIP 18 from the housing 14.

The SIP 18 can readily be removed from the socket assembly 18 by merely urging the latches 92 and 94 away from one another. The resiliency of the deflected terminals 16 normally will be sufficient to rotate the cover 12 away from the rear wall 84 of the housing 14 and free of the latches 92 and 94. However, in some instances, it may be necessary to exert a slight additional force on the cover 12 which is facilitated by the access opening 86 in the rear wall 84. The SIP can then be removed from the cover 12 by merely deflecting the latches 52 to permit slidable removal of the SIP 18 along the channels 44 and 46.

In summary, a SIP socket assembly is provided including a housing and a cover selectively engageable with the housing. The cover defines an opened bottom box-like enclosure into which the SIP is slidably receivable. The cover is dimensioned to permit the mating edge of the SIP to extend from the opened bottom of the cover. However, latches extending in proximity to the opened bottom may lockingly engage the mating edge of the SIP. The housing includes an elongated slot for receiving the mating edge and a plurality of terminals disposed in proximity to the slot for engaging conductive regions along the mating edge of the SIP. The housing may include an alignment surface for engaging a corresponding surface of the cover to ensure proper initial positioning of the cover and the SIP relative to the housing. The housing may further include deflectable latches for retaining the cover and SIP in an angular alignment corresponding to complete mating. Forces exerted by the latches on the cover cannot damage the fragile components of the SIP disposed protectively within the cover. The housing may further include protrusions for engaging the cover and preventing an improper removal of the cover and SIP from the housing.

While the invention has been described with respect to a preferred embodiment, it is apparent that various changes can be made without departing from the scope of the invention as defined by the appended claims.

I claim:

1. A socket assembly for receiving a circuit member having a planar substrate with a mating edge having a plurality of conductive regions disposed therealong, said socket assembly comprising:
   a cover for receiving and releasably mounting therein the planar substrate of the circuit member with the mating edge extending from the cover; and,
   a housing having an opening adapted to receive said cover and having a mating slot formed in said housing for receiving the mating edge of the circuit member, latch means defined on said housing in proximity to the slot for lockingly engaging the cover when the mating edge of the circuit member is disposed in the slot at a selected angular alignment.

2. A socket assembly as in claim 1 wherein the cover includes a positioning wall disposed generally in proximity to the open bottom of the cover for preventing over-insertion of the circuit member in a first angular alignment thereof with respect to the housing.

3. A socket assembly as in claim 1 wherein the substrate of the circuit member includes a pair of generally parallel side edges extending orthogonally from the mating edge, and wherein the cover includes a pair of parallel channels for slidably receiving the side edges of the substrate.

4. A socket assembly as in claim 3 wherein the cover includes opposed spaced apart front and rear walls, the channels being disposed in proximity to the front wall of the cover and spaced from the rear wall thereof, such that the rear wall of the cover is spaced from the substrate engaged in the channels for protecting circuitry disposed on the substrate of the circuit member.

5. A socket assembly as in claim 3 wherein the cover defines a substantially rectangular open bottom enclosure dimensioned such that the mating edge of the circuit member extends from the open bottom of the cover.

6. A socket assembly as in claim 5 wherein the cover further comprises latch means extending from the open bottom for lockingly engaging the circuit member.

7. A socket assembly as in claim 6 wherein the latch means comprise a plurality of deflectable latches extending from the open bottom a selected distance for lockingly engaging the mating edge of the circuit member inserted into the cover.

8. A socket assembly as in claim 7 wherein the housing comprises a plurality of notches for receiving the deflectable latches of the cover.

9. A socket assembly as in claim 1 wherein the cover comprises a plurality of locking shoulders disposed at locations thereon remote from the opened bottom of the cover, and wherein the housing includes a plurality of projections for engaging the locking shoulders of the cover as the cover is rotated into a position corresponding to full mating of the circuit member.

10. A socket assembly as in claim 9 wherein the locking shoulders of the cover are angularly aligned to the substrate of the circuit member for facilitating rotation of the cover into locking engagement with the projections on the housing.

11. A socket assembly as in claim 1 wherein the housing includes first and second upstanding end walls at opposed longitudinal ends of the mating slot and a rear wall connected to and extending unitarily between the end walls, the latches of the housing being disposed intermediate the respective end walls.

12. A socket assembly as in claim 11 wherein the rear wall is formed to include an access opening for accessing the cover to enable selective separation of the cover and circuit member from the housing.

13. A socket assembly as in claim 11 wherein the rear wall includes a plurality of locking projections extending therefrom for lockingly engaging a portion of the shoulder to prevent non-rotatable separation of the cover from the housing.

14. A socket assembly as in claim 11 further comprising a plurality of terminals lockingly engaged in the housing for electrically contacting the conductive region along the mating edge of the circuit member upon insertion of the circuit member into the mating slot of the housing.

15. A socket assembly for receiving a circuit member having a planar substrate with a mating edge having a plurality of conductive regions disposed therealong, said socket assembly comprising:
an opened bottom cover for receiving and releasably mounting therein the planar substrate of the circuit member with the mating edge of the circuit member extending from the opened bottom of the cover, said cover comprising a rigid positioning wall in proximity to the opened bottom end of the cover; and
a housing having an opening adapted to receive said cover and having an elongated mating slot formed in said housing for receiving the mating edge of the circuit member, a plurality of terminals being securely mounted adjacent to the slot in the housing for engaging the conductive regions of the circuit member, said housing comprising an alignment face in proximity to the slot for engaging the positioning wall of the cover and defining a limit to the movement of the circuit member into the slot of the housing, said housing further comprising a substantially rigid rear wall spaced from the slot for engaging the cover and defining a range of rotational movement of the cover relative to the housing.

16. A socket assembly as in claim 15 wherein the cover further comprises a plurality of deflectable latches extending from the opened bottom face thereof for engaging the mating edge of the circuit member and retaining the circuit member securely within the cover.

17. A socket assembly as in claim 15 wherein the cover comprises channel means for engaging the circuit member and preventing movement of the circuit member within the cover.

18. A socket assembly as in claim 15 wherein the housing further comprises a plurality of deflectable latches for securely retaining the cover generally adjacent the rear wall of the housing.

* * * * *